(12) United States Patent
Iben et al.

(10) Patent No.: US 8,445,789 B2
(45) Date of Patent: May 21, 2013

(54) CABLE HAVING ESD DISSIPATIVE ADHESIVE ELECTRICALLY CONNECTING LEADS THEREOF

(75) Inventors: Icko E. Tim Iben, Santa Clara, CA (US); Wayne Alan McKinley, Tucson, AZ (US); George G. Zamora, Vail, AZ (US)

(73) Assignee: International Business Machines Corporation, Armonk, NY (US)

( * ) Notice: Subject to any disclaimer, the term of this patent is extended or adjusted under 35 U.S.C. 154(b) by 1284 days.

(21) Appl. No.: 12/125,004

(22) Filed: May 21, 2008

(65) Prior Publication Data

US 2009/0288864 A1 Nov. 26, 2009

(51) Int. Cl.
*H05K 1/02* (2006.01)

(52) U.S. Cl.
USPC ........... 174/259; 174/250; 174/251; 174/252; 174/253; 174/254; 174/255; 174/256; 174/257; 174/258; 174/260; 174/261

(58) Field of Classification Search
USPC .................................................. 174/250–261
See application file for complete search history.

(56) References Cited

U.S. PATENT DOCUMENTS

| | | | | |
|---|---|---|---|---|
| 6,468,376 | B2 | 10/2002 | Biskeborn et al. | 156/228 |
| 6,927,951 | B2 * | 8/2005 | Huha et al. | 360/323 |
| 7,223,922 | B2 | 5/2007 | Bandy, IV et al. | 174/254 |
| 7,247,588 | B2 | 7/2007 | Kwon et al. | 501/105 |
| 7,274,536 | B2 | 9/2007 | Deshpande et al. | 360/234.7 |
| 7,285,846 | B1 * | 10/2007 | Tran | 257/667 |
| 2003/0218851 | A1 * | 11/2003 | Harris et al. | 361/118 |
| 2006/0098351 | A1 * | 5/2006 | Iben | 360/323 |
| 2006/0152334 | A1 * | 7/2006 | Maercklein et al. | 338/210 |
| 2007/0146941 | A1 * | 6/2007 | Harris et al. | 361/18 |

* cited by examiner

*Primary Examiner* — Jinhee Lee
*Assistant Examiner* — James Wu
(74) *Attorney, Agent, or Firm* — Zilka-Kotab, PC

(57) ABSTRACT

A cable in one embodiment comprises a plurality of leads; and an electrostatically dissipative adhesive operatively electrically coupling the leads together, the adhesive comprising a mixture of an adhesive material and electrically conductive particles intermixed with the adhesive material. A method in one embodiment comprises applying an electrostatically dissipative adhesive to exposed leads of a cable for operatively electrically coupling the leads together, the adhesive comprising a mixture of an adhesive material and electrically conductive particles intermixed with the adhesive material. Additional embodiments are presented.

18 Claims, 7 Drawing Sheets

CABLE HAVING ESD DISSIPATIVE ADHESIVE ELECTRICALLY CONNECTING LEADS THEREOF

FIELD OF THE INVENTION

The present invention relates to cables, and more particularly, this invention relates to cables having an electrostatic discharge (ESD) adhesive electrically coupling leads thereof together.

BACKGROUND OF THE INVENTION

Magnetic head-based systems have been widely accepted in the computer industry as a cost-effective form of data storage. In a magnetic tape drive system, a magnetic tape containing a multiplicity of laterally positioned data tracks that extend along the length of the tape is drawn across a magnetic read/write transducer, referred to as a magnetic tape head. The magnetic tape heads can record and read data along the length of the magnetic tape surface as relative movement occurs between the heads and the tape.

In a magnetic disk drive system, a magnetic recording medium in the form of a disk rotates at high speed while a magnetic head "flies" slightly above the surface of the rotating disk. The magnetic disk is rotated by means of a spindle drive motor.

Magnetoresistive (MR) sensors are particularly useful as read elements in magnetic heads, used in the data storage industry for high data recording densities. Three examples of MR materials used in the storage industry are anisotropic magnetoresistive (AMR), giant magnetoresistive (GMR) and tunneling magnetoresistive (TMR). An MR sensor is one whose resistance is changed by a magnetic field. MR, e.g., AMR, GMR and TMR, sensors are deposited as small and thin multi-layered sheet resistors on a structural substrate. The sheet resistors can be coupled to external devices by contact to metal pads which are electrically connected to the sheet resistors. MR sensors provide a high output signal which is not directly related to the head velocity as in the case of inductive read heads.

To achieve the high areal densities required by the data storage industry, the sensors are made with commensurately small dimensions. The smaller the dimensions, the more sensitive the thin film resistors become to damage from spurious current or voltage spikes.

A major problem that is encountered during manufacturing, handling and use of MR sheet resistors as magnetic recording transducers is the buildup of electrostatic charges on the various elements of a head or other objects which come into contact with the sensors, particularly sensors of the thin film type, and the accompanying spurious discharge of the static electricity thus generated. Static charges may be externally produced and accumulate on instruments used by persons performing head manufacturing or testing function. These static charges may be discharged through the head, causing physical and/or magnetic damage to the sensors.

As described above, when a head is exposed to voltage or current inputs which are larger than that intended under normal operating conditions, the sensor and other parts of the head may be damaged. This sensitivity to electrical damage is particularly severe for MR read sensors because of their relatively small physical size. For example, an MR sensor used for high recording densities for magnetic tape media (on the order of 25 MBytes/cm$^2$) are patterned as resistive sheets of MR and accompanying materials, and will have a combined thickness for the sensor sheets on the order of 500 Angstroms (Å) with a width of a few microns (µm) and a height on the order of 1 µm. Sensors used in extant disk drives are even smaller. Discharge currents of tens of milliamps through such a small resistor can cause severe damage or complete destruction of the MR sensor. The nature of the damage which may be experienced by an MR sensor varies significantly, including complete destruction of the sensor via melting and evaporation, oxidation of materials at the air bearing surface (ABS), generation of shorts via electrical breakdown, and milder forms of magnetic or physical damage in which the head performance may be degraded. Short time current or voltage pulses which cause extensive physical damage to a sensor are termed electrostatic discharge (ESD) pulses.

One major source of ESD damage is associated with tribocharging of the flexible cables used to attach the heads to the external devices. High magnitude currents sufficient to damage a head can occur when the cables are tribocharged and the distal end of the cable makes electrical contact with an external device or piece of metal. The resultant discharge may result in damage as described above.

Another potential cause of ESD damage to sensitive electronics is the creation of a potential difference between two different elements within a device. An approach to protect against this damage is to connect the elements together on the wafer. However, this approach can be costly. Furthermore, in the case of tape heads, due to the large number of elements in a tape head, space on the wafer is limited and can preclude attaching resistive elements onto the wafer for this purpose.

Another major cause of ESD damage is termed machine-model (MM) ESD. MM ESD occurs when a differential in voltages exists between an element (sensor) which is bonded onto a cable and an external tester or device to which the cable is attached. When the sensor is attached directly to the external tester or device, high level currents can flow to equalize the voltages. The high current levels can cause damage to the sensor. A common practice to protect the sensors from damage is use a high impedance connection to the ground potential of any tester/device or tool (external device) to which the sensor is to be connected in order to equalize the voltage potential of the sensor and the external device prior to connecting the sensors with a low resistance connection for use or test. Such an approach would be to bridge the element lead connections to the external device with a high impedance resistor prior to attaching to the external connector. An external resistor, though, can add significant capacitance between the element and the resistive element and may not work. Also, this approach can be difficult to execute in a manufacturing environment. In order to function properly, the minimum amount of capacitance should introduced be between the sensor and the high impedance device to avoid charge build up which can damage the sensor. An approach is to attach a high impedance resistor directly onto a cable which is attached to the device elements (e. readers and writers). This, though, requires costly alignment and bonding tools.

Another approach which solves part of the problem is to use an ESD dissipative sheet with an insulating adhesive layer to bond the dissipative sheet above the leads. While this serves to mitigate tribocharging of the cable, it does not solve the problem of MM ESD.

In summary, the detractors of current solutions are: cost, lack of space, and the need for multiple solutions to solve the different problems.

SUMMARY OF THE INVENTION

A cable in one embodiment comprises a plurality of leads; and an electrostatically dissipative adhesive operatively electrically coupling the leads together, the adhesive comprising a mixture of an adhesive material and electrically conductive particles intermixed with the adhesive material.

A cable in another embodiment comprises a plurality of leads; and an electrostatically dissipative adhesive located in a window of the cable, the adhesive operatively electrically coupling the leads together, the adhesive comprising a mixture of an adhesive material and electrically conductive particles intermixed with the adhesive material, the window being positioned between the ends of the cable.

A cable in yet another embodiment comprises an insulating layer; a plurality of leads; and an electrostatically dissipative adhesive coupling the leads to the insulating layer, the adhesive operatively electrically coupling the leads together, the adhesive comprising a mixture of an adhesive material and electrically conductive particles intermixed with the adhesive material.

A method in one embodiment comprises applying an electrostatically dissipative adhesive to exposed leads of a cable for operatively electrically coupling the leads together, the adhesive comprising a mixture of an adhesive material and electrically conductive particles intermixed with the adhesive material.

Any of these embodiments may be implemented in a magnetic data storage system such as a tape drive system, which may include a magnetic head as recited above, a drive mechanism for passing a magnetic medium (e.g., recording tape) over the magnetic head, and a controller electrically coupled to the magnetic head.

Other aspects, advantages and embodiments of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

Figure 1A:
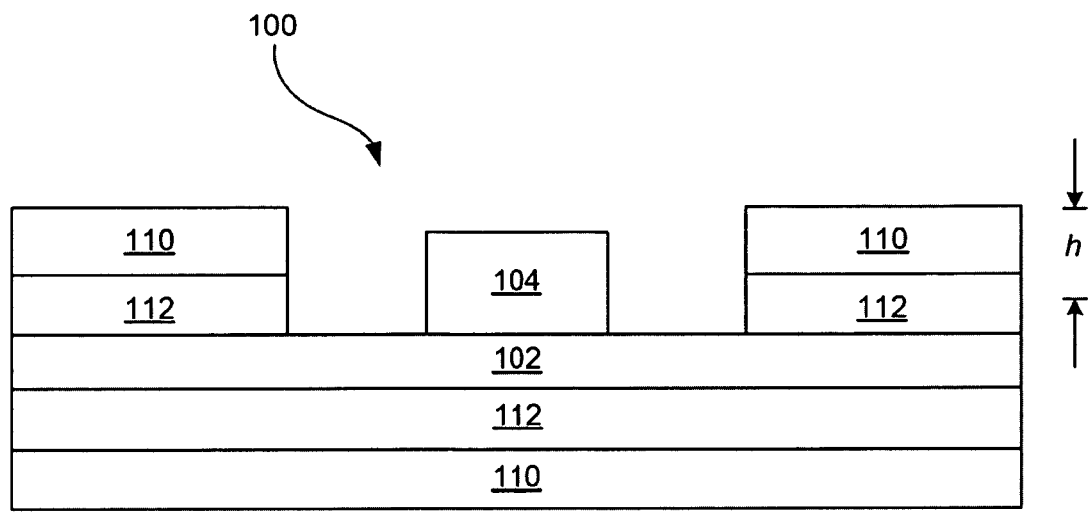
FIG. 1A is a partial top view, not to scale, of a cable having an ESD dissipative adhesive applied through a section of the cable where the metal leads are exposed.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

In the drawings, like and equivalent elements are numbered the same throughout the various figures.

The following description discloses several preferred embodiments of cables having an ESD dissipative adhesive coupling leads thereof together for protecting delicate components of an electronic device from ESD and/or Electrical Overstress (EOS) damage.

One general embodiment of the present invention includes a cable comprising a plurality of leads, and an electrostatically dissipative adhesive operatively electrically coupling the leads together. The adhesive comprises a mixture of an adhesive material and electrically conductive particles intermixed with the adhesive material. By "operatively electrically coupling" what is meant is that the leads are somehow electrically coupled together using the adhesive, whether the adhesive forms a direct electrical path between leads, or only a portion thereof. Accordingly, the leads may be coupled directly together, operatively coupled together via a bar or the like in conjunction with the adhesive as described below, operatively coupled together by connection of pads or pins in communication therewith, etc.

Another general embodiment of the present invention includes a cable comprising a plurality of leads; and an electrostatically dissipative adhesive located in a window of the cable, the adhesive operatively electrically coupling the leads together, the adhesive comprising a mixture of an adhesive material and electrically conductive particles intermixed with the adhesive material, the window being positioned between the ends of the cable. Accordingly, the leads may be coupled directly together, operatively coupled together via a bar or the like as described below, operatively coupled together by connection of pads or pins in communication therewith, etc Yet another general embodiment of the present invention includes a cable comprising an insulating layer; a plurality of leads; and an electrostatically dissipative adhesive coupling the leads to the insulating layer, the adhesive operatively electrically coupling the leads together, the adhesive comprising a mixture of an adhesive material and electrically conductive particles intermixed with the adhesive material.

Yet another general embodiment of the present invention includes a method comprising applying an electrostatically dissipative adhesive to exposed leads of a cable for operatively electrically coupling the leads together, the adhesive comprising a mixture of an adhesive material and electrically conductive particles intermixed with the adhesive material. Accordingly, the leads may be coupled directly together, operatively coupled together via a bar or the like as described below, operatively coupled together by connection of pads or pins in communication therewith, etc.

In various embodiments, an ESD dissipative adhesive on or in a cable connect the leads together to maintain an equipotential between the different elements. Accordingly, various embodiments solve issues related to both cable tribocharging and ESD damage from the charge device model type (CDM) and MM. In such embodiments, the ESD dissipative adhesive is electrically connected to the cable leads and serves as an ESD dissipative connection between the leads.

Figure 1B:
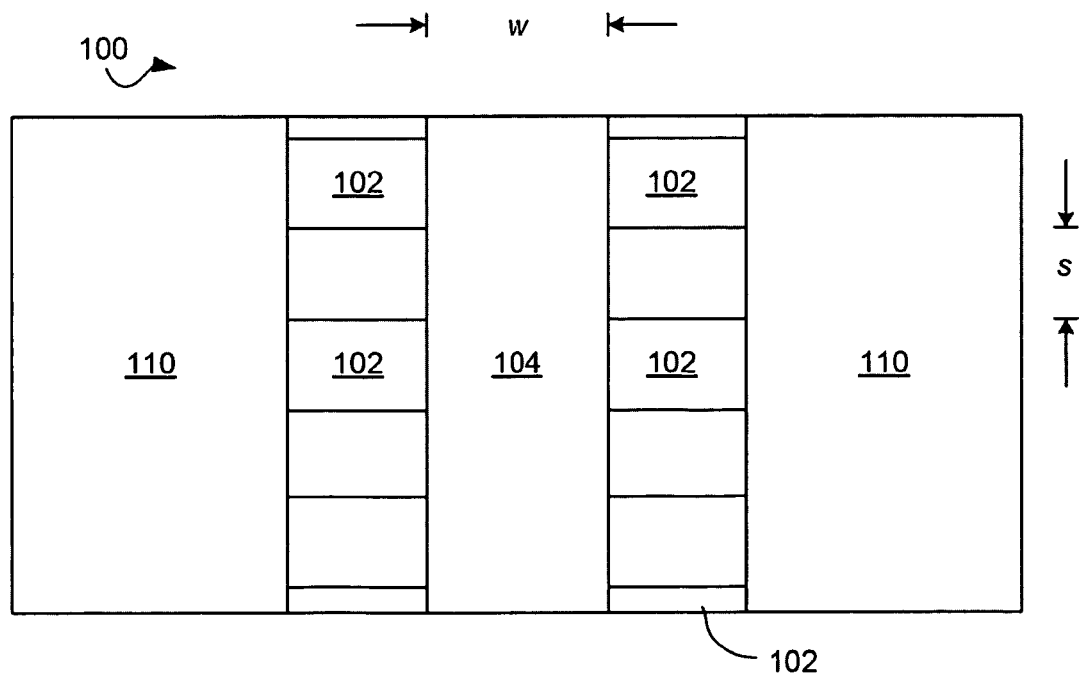
FIG. 1B is a top down view of FIG. 1A.

FIG. 1A is a partial top view of a cable 100 having an ESD dissipative adhesive 104 applied through a section of the cable where the metal leads 102 are exposed, e.g., through a window in the cable. FIG. 1B is a top down view of FIG. 1A. Preferably, the window is contiguous, but could also be broken into individual sections.

Thus, the ESD dissipative adhesive can be used to electrically connect to the cable leads to, for example, serve as an ESD dissipative connection between the elements attached to the leads.

The particular composition of the ESD dissipative adhesive 104 is not critical. Examples of suitable ESD dissipative adhesives are presented below.

For an adhesive strip having an equivalent width w and separation between leads (FIG. 1B), the shunt resistance ($R_{shunt}$) is given by:

$$R_{shunt} = R_{sheet} * s/w \quad \text{Equation 1}$$

The sheet resistivity ($R_{sheet}$) of the ESD dissipative adhesive and the dimensions of the ESD dissipative adhesive are chosen to yield the desired resistive connections, and will be discussed in a later section.

The thickness and width of the adhesive can be achieved by controlling the volume of adhesive used and using a mechanical dispensing system. The thickness can be controlled by placing an insulating sheet on top of the applied adhesive and applying a uniform pressure during curing. A fixed thickness may not be necessary, and a wide range of connective resistances could be used in some applications.

The ESD dissipative adhesive, as used on the cable, preferably has a thickness sufficient to exhibit an ESD surface resistivity in the range of about $10^6$ to about $10^{12}$ ohms/sq (ohms per square). In particularly preferred embodiments, the ESD dissipative surface resistivity is in the range of about $1 \times 10^6$ to $1 \times 10^8$ ohms/sq. For example, one illustrative embodiment has an ESD dissipative surface resistivity in the range of about $0.5 \times 10^7$ to about $1 \times 10^7$ ohm/sq. In a further embodiment, the ESD dissipative surface resistivity is about $1 \times 10^7$ ohms/sq. An ESD conductive adhesive applied to the cable in the disclosed range of conductivity should not conduct substantial RF or EMI currents, but serves as an ESD dissipative connection between the leads in the cable.

The various parts of the cable material can be any desired material including metal (e.g., leads and pads formed of copper, gold, etc.), insulating material 110 (e.g., KAPTON), adhesives 112, liquid crystal, etc.

In one embodiment, an ESD dissipative adhesive is applied to one or more of the outer surfaces of a premanufactured cable. Again, the bulk of the cable material can be any desired material. The ESD dissipative adhesive may be extruded, sprayed, painted on with an applicator, or otherwise applied to the cable by any suitable mechanism.

For example, one method for applying an ESD dissipative adhesive to a cable includes the following steps. Ensure that the cable is free of dirt, grease, oils and is dry. Position the cable with the surface to which the adhesive is to be applied is facing up. Extrude a strip of ESD dissipative adhesive onto the surface of the cable. Allow the adhesive to dry, or cure the adhesive. To cure the adhesive, heated air can be blown against the cable after each application. Ultra Violet (U.V.) light can also be used for curing some adhesives.

In other embodiments, the ESD dissipative adhesive is applied during cable manufacture. Methods such as those above as well as printing, e.g., Gravier printing; lamination; co-extrusion; etc. can be used.

The foregoing methods of application may also be used with the embodiments set forth below.

The ESD dissipative adhesive can also be used as a high impedance resistor attached to a cable to avoid damage to the elements when connecting up to an external test device. One end of the high impedance resistor may be electrically mechanically attached to one or more of the elements on the cable (leads). The other end of the high impedance resistor can be attached to the external device to discharge any voltage differential between the cable elements and external test device.

Figure 2A:
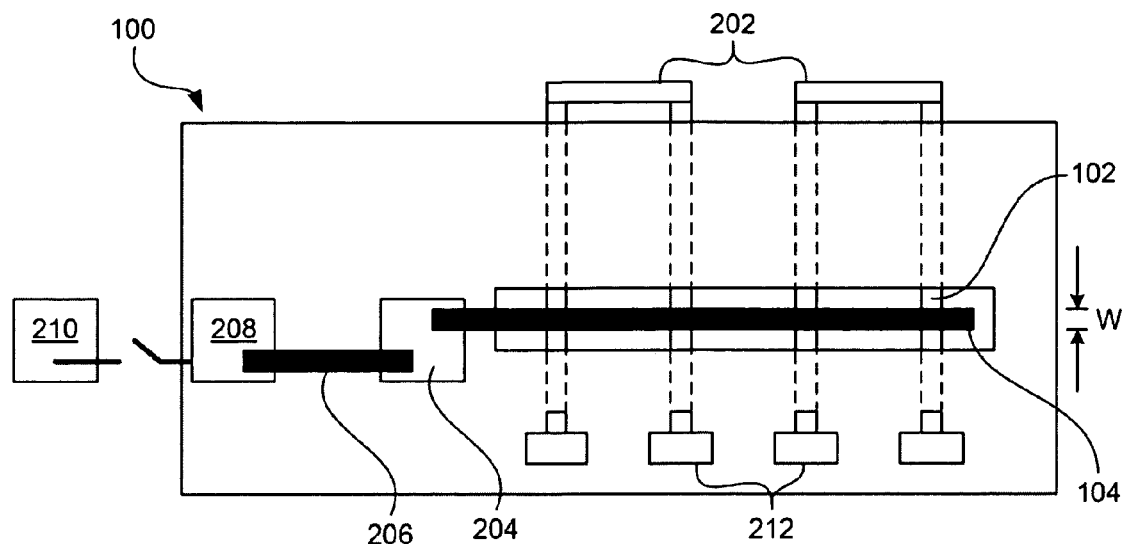
FIG. 2A is a partial system diagram, not to scale, of a system comprising a cable having an ESD dissipative adhesive according to one embodiment.
Figure 2B:
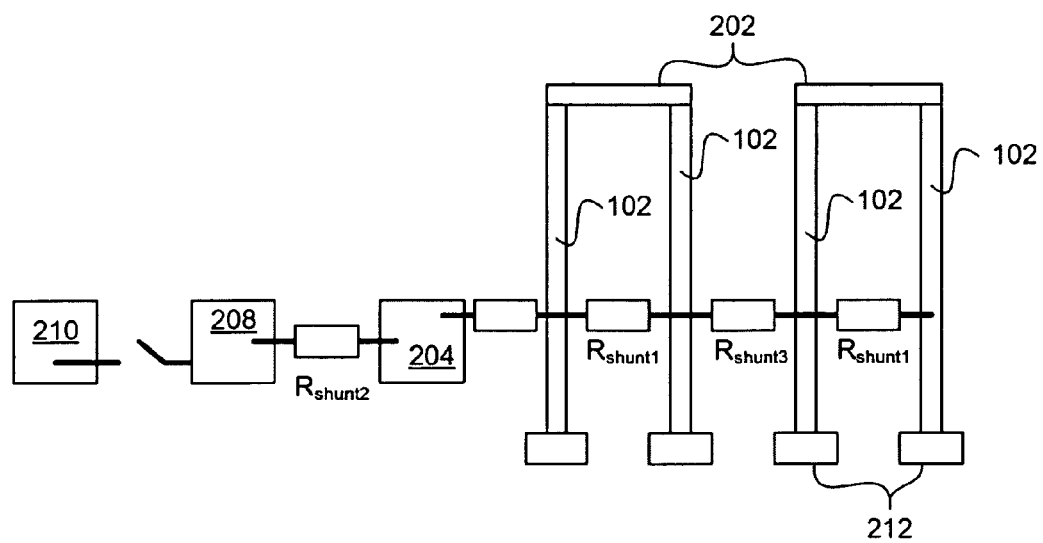
FIG. 2B is a simplified equivalent circuit of the embodiment shown in FIG. 6A.

An illustrative embodiment of an ESD dissipative adhesive on a cable 100 is shown in FIG. 2A. The simplified equivalent circuit is shown in FIG. 2B. In FIG. 2A, two elements 202, e.g., magnetic sensors, are shown from a top view. To maintain the two elements 202 at about the same voltage level when not connected to any test equipment, a first ESD dissipative adhesive 104 is bonded across the leads 102 and to a first contact pad 204. This forms a resistive bridge between the leads of a given element 202 given by $R_{shunt1}$ and between the leads of different elements 202 given by $R_{shunt3}$. $R_{shunt3}$ and $R_{shunt1}$ may be the same value or they may be different, depending primarily on the separation of the nearest leads between the elements compared to the separation of the two leads of a sensor. An ESD dissipative layer 206 or other layer/device may be present between the first pad 204 and second pad 208, forming a connection between the pads 204, 208 of resistance $R_{shunt2}$. The ESD dissipative layer 206 may be an ESD dissipative adhesive having the same or a different composition as the adhesive 104 on the cable, an ESD dissipative sheet, etc. Alternatively, the connection can be made by using a diode or crossed diodes, a resistor or resistive sheet, etc. A contact wire can then be used to make contact to the ground of an external device 210 to enable equalization of the electrical potential of the leads 104, the sensors 202, and the external device 210 prior to final connection of the individual sensors 202 to the external devise for test or use. Because $R_{shunt2}$ separates the elements and the external device, $R_{shunt2}$ can be used to control the flow of charge from the cabled elements to the external ground in a manner so as to not damage the elements, as described below. $R_{shunt1}$, $R_{shunt2}$ and $R_{shunt3}$ can be chosen to be the same or of different values, as discussed later. Final connection of the elements to the external device for testing or use is to connect the pads 212 to the appropriate connectors on the external device.

Further embodiments implement an electrically conductive bar, the ESD dissipative adhesive coupling the leads to the bar. The bar can comprise any electrically conductive material. The particular shape, dimensions, and nonelectrical properties of the bar is not critical. Accordingly, it can be rigid, deformable, resiliently deformable, etc. Further, though called a bar herein, the conductive bar may be in the form of a sheet, thread, wire, etc. The bar may be integrated with the cable, for example the bar can be built into the cable, attached thereto after fabrication of the cable, etc. The bar can also be detachably coupled to the cable.

Figure 3A:
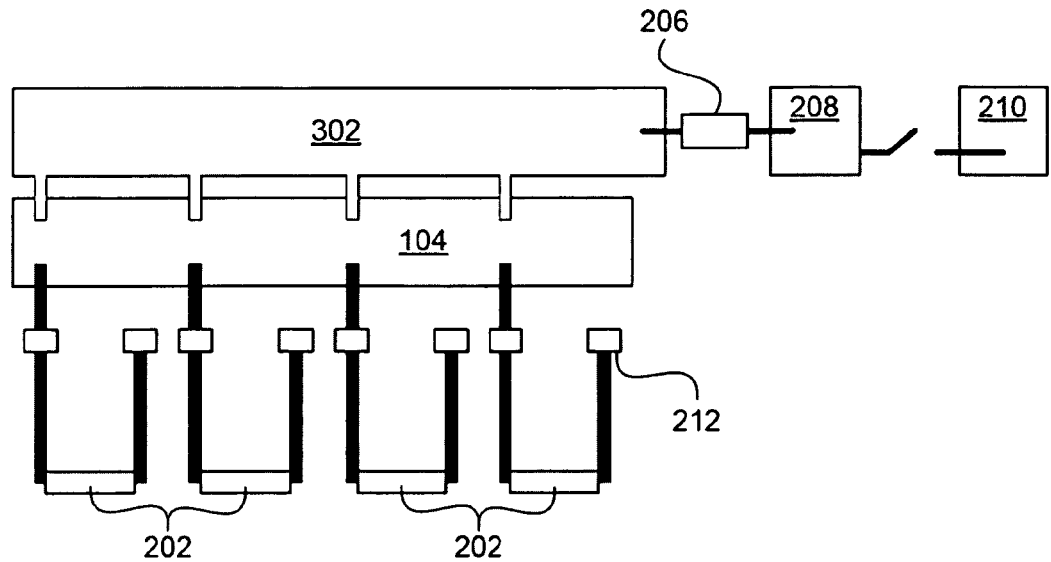
FIG. 3A is a partial system diagram, not to scale, of a system comprising a cable having an ESD dissipative adhesive, and a conductive bar, according to one embodiment.

Embodiments using the conductive bar are particularly useful when the leads are separated by a long space. In the case of many leads, the approach shown in FIG. 2A will have a resistance $R_{shunt1}$ between leads of the elements 202, but a resistance $N \times R_{shunt1}$ between element 1 and element N−1. A design which remedies the above mentioned problem with many leads is the geometry for connecting elements together shown in FIG. 3A. The layout in FIG. 3A is similar to that described in FIG. 2A, but in FIG. 3A, a conductive bar 302 is added to the system, and connection 206 couples the conductive bar 302 to the pad 208. The design makes the resistance about the same between any of the elements and a common equipotential (conductive bar).

Figure 3B:
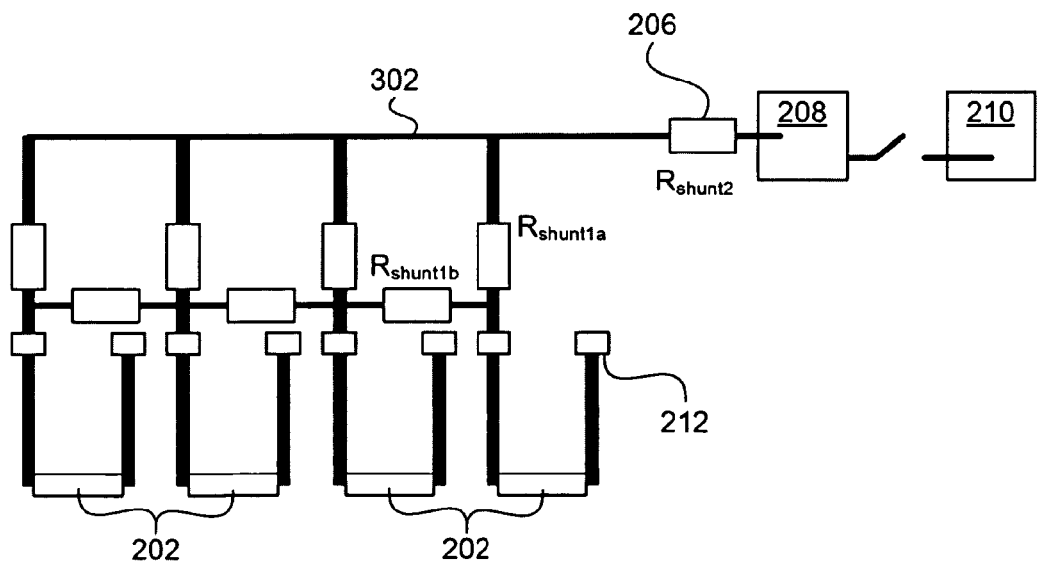
FIG. 3B is a simplified equivalent circuit of the embodiment shown in FIG. 7A.

The equivalent circuit for FIG. 3A is given in FIG. 3B. In the equivalent circuit, two shunt resistors are shown: $R_{shunt1a}$ and $R_{shunt1b}$. $R_{shunt1a}$ is the resistance between an element lead and the conductive bus bar. $R_{shunt1b}$ is the resistance through the ESD dissipative adhesive 104 between adjacent elements. As an option, as shown in FIG. 3A, only one lead from each element is connected to the ESD dissipative adhesive 104 since the resistance across the element 202 ($R_{dut}$) is assumed to be much less than the resistances across the ESD dissipative adhesive 104. $R_{shunt1b}$ may be less than $R_{shunt1a}$, but this is not necessary.

Figure 4:
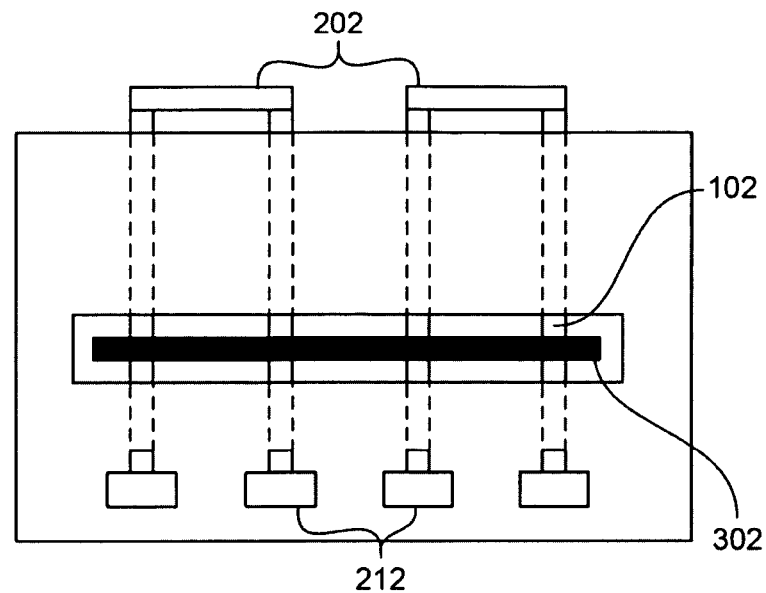
FIG. 4 is a partial system diagram, not to scale, of a system comprising a cable having an ESD dissipative adhesive, and a conductive bar, according to one embodiment.

Another approach similar in concept to the one shown in FIG. 3A, but differing in geometry is shown in FIG. 4. In FIG. 4, the conductive bus-bar 302 is connected as a layer in direct contact with the ESD dissipative adhesive.

In various embodiments, an ESD dissipative adhesive forms a portion of a layer of the cable, or a layer of the cable. The ESD dissipative adhesive can be embedded in the cable, partially exposed, etc.

In one approach for connecting the leads together in the cable is to use an ESD dissipative adhesive for a portion of or the entire bond for a layer of the cable on the top, the bottom or both the top and bottom. Again the choice of the sheet resistance of the ESD dissipative adhesive is chosen to achieve the desired resistance between the leads.

Figure 5:
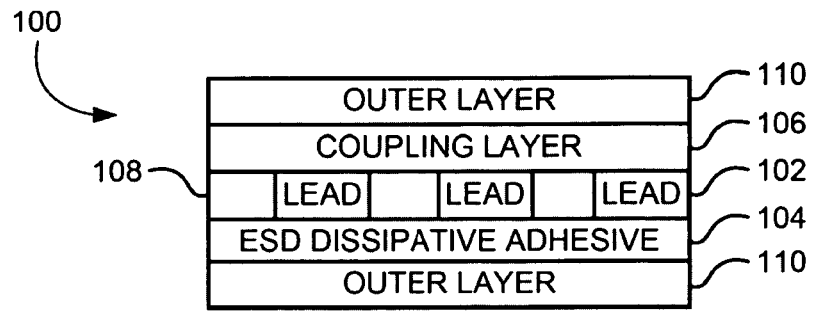
FIG. 5 is a simplified partial cross sectional view, not to scale, of a cable having an ESD dissipative adhesive according to one embodiment.

FIG. 5 illustrates a partial cross section of a cable 100 having leads 102 of a metal or other conductive material, a coupling layer 106 skirting the leads 102, and an ESD dissipative adhesive 104 electrically coupled to the leads 102. An insulating layer 108 separates the leads. The ESD dissipative adhesive 104 and the coupling layer 106, respectively, couples outer layers 110 to the leads 102. The outer layers 110 are preferably electrically insulative, but need not be. Note that layers can be added or removed per the desires of the designer or requirements of the particular application.

Figure 6:
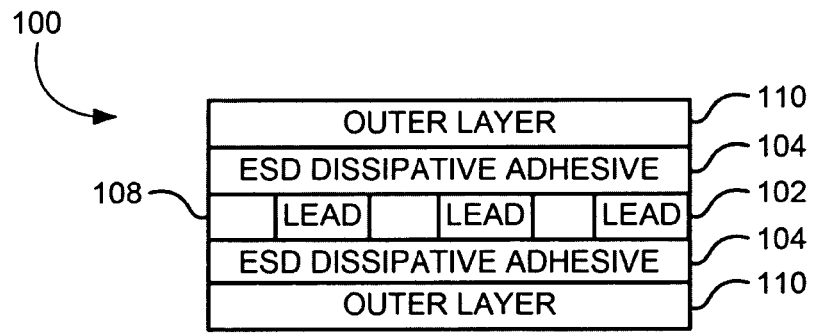
FIG. 6 is a simplified partial cross sectional view, not to scale, of a cable having ESD dissipative layers according to one embodiment.

FIG. 6 depicts a variation having an ESD dissipative adhesive 104 on both sides of the leads 102.

The ESD dissipative adhesive may extend across a substantial portion of a particular side, or both sides, of the cable, e.g., >50%, more preferably >80%, even more preferably >90% of the surface area of the particular side (or sides) of the cable. The ESD dissipative adhesive may also extend across an entire length of one or both sides of the cable. In other approaches, the ESD dissipative adhesive may be smaller, bridging only a section of the cable.

Figure 7:
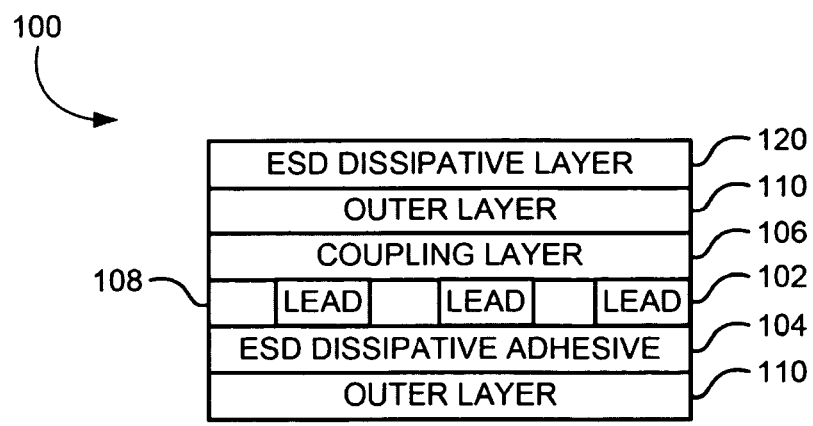
FIG. 7 is a simplified partial cross sectional view, not to scale, of a cable having an ESD dissipative adhesive according to one embodiment.

FIG. 7 depicts yet another variation having a structure similar to that of FIG. 5, and in addition having an ESD dissipative material 120 formed on an outer surface thereof. This provides an extra level of protection from such things as tribocharging of the cable by rubbing.

An illustrative ESD dissipative material is a thin polymer which has conductive materials interspersed to make the polymer sheet resistance in the range set forth above. One such material is KAPTON® XC polyimide film sold by DuPont. DuPont KAPTON® XC polyimide films are electrostatically dissipative, which are precisely loaded with conductive carbons to produce films with tightly controlled surface resistivities. The resistive property is throughout the bulk of the film, so it cannot be cracked, rubbed off or otherwise easily damaged, as is often the case with surface coatings or metallizations. In addition to anti-static properties, KAPTON® XC film provides inertness, radiation and temperature resistance similar to that of other KAPTON® films such as those typically used to construct cables. Experimentation has shown that when a cable coated with KAPTON® XC film is rubbed with a nitrite glove ten times, the cable does not display any significant surface charge (<10V versus >1000V if standard KAPTON material is rubbed).

KAPTON® 100XC10E7 is a one mil thick film with a nominal surface resistivity of $10^7$ ohm/sq. One mil equals one thousandth of an inch (0.0254 millimeter). Custom constructions are also available from DuPont, and can be produced in thickness from 1 to 5 mil, and with surface resistances from 20 to $10^9$ ohms/sq. KAPTON® 100XC10E7 film is supplied in rolls.

Additional layers may be bonded to one or more other layers of the cable by any suitable mechanism, including application of an appropriate adhesive such as heat-activated PYRALUX® sold by DuPont. Alternatively, various layers, including those listed above, can have an adhesive backing already formed thereon.

Cables in some embodiments may further include a ground plane, though such ground planes often provide undesirable capacitive coupling to the environment.

As an option, an antistatic coating may be applied to the cable. In one approach an outer layer of the cable may be any suitable substrate for the antistatic coating. For example, the outer layer can be polymeric, e.g., of polyester. Note that layers can be added or removed per the desires of the designer or requirements of the particular application. The antistatic coating can be formed of any antistatic material known in the art. Note that the antistatic coating is not to be confused with an ESD dissipative material, which dissipates charge by electrical conduction through the bulk of the material or on its surface. An antistatic material reduces the probability of tribocharging when two surfaces rub together.

In any of the embodiments described herein, the ESD dissipative adhesive and other layers (not including the lead or optional conductive backplane or ground plane) may have an electrical resistivity that is sufficient to prevent significant shorting of the conductors and leads in the cable, as well as not significantly interfere with the signal being sent through the cable.

Table 1 lists results of experiments measuring the tribocharging potential of various sheet materials. In the "rubbed with nitrite gloves" experiments, a clean sheet of the material was rubbed with nitrite gloves ten times with one inch strokes. In the "peeling off from paper" experiments, a paper backing was peeled off of the material.

TABLE 1

| Material | Rubbed with Nitrite glove Voltage (Volts) | Peeling off from paper Voltage (Volts) |
|---|---|---|
| Kapton XC $10^7$ ohm/sq | Insignificant | Insignificant |
| Kapton CPB $10^{12}$ ohm/sq | 50-400 | >3000 |
| LCP 3600 F02053 | 200-3000 | >3000 |

TABLE 1-continued

| Material | Rubbed with Nitrile glove Voltage (Volts) | Peeling off from paper Voltage (Volts) |
|---|---|---|
| Kapton/Pyralux, LF7001 Dupont | >1000 | >3000 |
| LCP 3800 | >1500 | >3000 |
| LCP 212141 | >1000 | >3000 |

Expanding on the results shown in Table 1, rubbing a cable (KAPTON CPB (polyimide) cleaned with isopropyl alcohol) with nitrile gloves charges the cable to over 250+100V.

Rubbing a clean sheet (Kapton LF7001 (polyimide)) with a finger or nitrile gloves charges the cable to over 1600V. Charge dissipation times are: 11, 102 and 450 seconds for 75%, 50%, 90% dissipation, respectively. The external voltage from the charged surface is dramatically shielded when the KAPTON sheet is placed over a metal (aluminum foil) but the external voltage "reappears" when the metal sheet is removed, indicating that the metal sheet insulated the charges on the KAPTON from external detection without removing the charges, thus hiding the potentially damaging charges from detection. The voltage with height drops by ~3.4% per mm.

Rubbing a clean cable (Kapton XC (polyimide with a small percentage of conductive graphite, $10^7$ Ω/sq)) with nitrile gloves results in no noticeable tribocharging, even when holding with an insulator.

The cables thus described with an inner and/or outer ESD dissipative layer are effectively immune to charge build up and thus eliminate this mechanism as a source of ESD or EOS damage. The cables described herein are suitable for use with any device or electronic component for which ESD or EOS protection is desired. The cables are especially useful when coupled to MR sensors in magnetic storage devices such as tape drives and disk drives.

Figure 8:
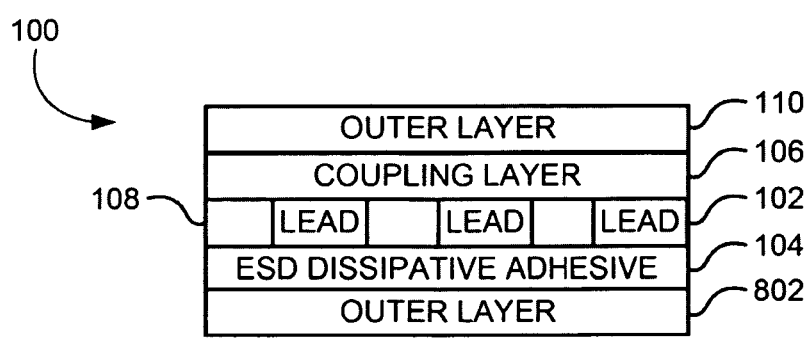
FIG. 8 is a simplified partial cross sectional view, not to scale, of a cable having an ESD dissipative adhesive according to one embodiment.

FIG. 8 depicts another variation showing a slice through the cable, for the schematic shown in FIG. 4. Notice that FIG. 8 replicates FIG. 5, except that the bottom outer layer 110 is replaced with a conductive layer 802. Layer 802 could be a metal or other conductive material chosen for it's electrical properties and preferably for good bonding to the ESD dissipative layer 104 and other reliability concerns. Stacks similar to FIG. 6 and FIG. 7 can also be imagined where the outer layer which contacts the ESD dissipative adhesive layer is replaced with a conductive layer.

Further, the preferred methods thus described do not significantly affect the cable mechanical properties such as bending stiffness or weight, making them preferable to other ESD and EOS prevention devices whose weight can interfere with actuation of the tape or disk heads.

In one general embodiment, an electrostatically dissipative adhesive comprises a mixture which includes an adhesive material with electrically conductive particles intermixed therein. The electrically conductive particles are present in an amount between 0% and about 10% by weight of a total weight of the mixture.

ESD dissipative adhesives in some embodiments may be made of commercially available adhesives commonly used for head component bonds by mixing the adhesive with an appropriate filler material, such as, but not limited to, carbon particulates, antimony doped Sn-oxide, and/or In:Sn:oxide.

In another approach, a special adhesive may be formulated specifically for the purpose of forming an ESD dissipative connection between different elements of the cable or cable and another system coupled thereto. For an adhesive bond having a separation s (as shown in FIG. 1B), height h (as shown in FIG. 1A), width w (as shown in FIG. 1B), and an adhesive resistivity p, the resistance of the electrostatically dissipative sheet (R) is given by Equation 2.

$$R = \frac{\rho \cdot s}{(h \cdot w)} \qquad \text{Equation 2}$$

In an experimental approach, 3M 2290 adhesive and LOCTITE 380 (cyanoacrylate) adhesive can each be made either conductive or ESD dissipative by doping the bonding material with carbon at levels between 0% and about 10% by weight. Carbon-filled LOCTITE 380 (when cured in an anaerobic curing system, preferably under Nitrogen) measured 2.6 kΩ and 40Ω for 5% and 10% carbon fill by weight, respectively. Carbon-filled 3M 2290, at 5% and 10% carbon fill by weight, yielded resistance values of 4 MΩ and 3.3 kΩ, respectively.

Other commercially available adhesives that have desirable bonding properties (such as strength, cure-time, ability to prevent component movement, etc.) could also be used with this method by adding >0% to about 10% by weight of a conductive filler material to the bonding material. Illustrative conductive filler materials include, but are not limited to, carbon, antimony doped Sn-oxide, In:Sn:oxide, etc. and combinations thereof.

In one approach, an adhesive may be cured according to manufacturer's instruction or in a manner well known in the art and result in a mixture which has an electrical resistance between two adjacent electrical contacts of at least about 3 kΩ (kilo-ohm), but below an electrically insulative level.

In another approach, an adhesive, when cured, may have an electrical resistance between two adjacent electrical contacts of at least about 1 MΩ (mega-ohm), but below an electrically insulative level. In a further approach, the cured adhesive has an electrical resistance between two adjacent electrical contacts of between about 10 kΩ and about 1 MΩ. In yet anther approach, the adhesive, when cured, has an electrical resistance between two adjacent electrical contacts of about 100 kΩ (kilo-ohm)±50 kΩ. Accordingly, it can be seen that the adhesive can have a multitude of different resistance values.

One approach is for a magnetic recording tape head or a hard disk drive (HDD) head with an appropriately chosen resistance to avoid ESD damage while not degrading the device performance.

Choice of Resistance Values for Shunts

One preferred criteria for choosing the resistance values for $R_{shunt1}$ and $R_{shunt3}$ used to electrically connect elements within the cable together is to maintain an equipotential voltage between the elements during fabrication and assembly processes while not significantly affecting the performance of the device. For maintaining an equipotential between the devices, the choice of a shunt resistance is to be as low as possible. For not affecting the performance of the device, the shunt resistance should be as high as possible.

As an example, take $R_{shunt1}$ to be across an element of resistance $R_{dut}$. The ratio ($R_{dut}/R_{shunt1}$) gives the leakage current through $R_{shunt1}$ rather than through $R_{dut}$. Since leakage current results in signal loss, this degrades performance and is undesirable. For magneto resistive (MR) heads used in tape drives, a 0.1% loss of signal is acceptable. For AMR, GMR and TMR readers, the resistance values are usually between 25 and 400Ω. Thus, an acceptable choice for $R_{shunt1}$ based on not affecting the performance would be values between 25 kΩ and 400 kΩ, with the lower and higher range values being used for the lower and higher values of the readers.

The next criteria to verify would be whether the values of $R_{shunt3}$ might be too high to achieve rapid equilibration of the different head elements. In a cable, one means of charging the cable which could lead to different local voltage potentials would be Tribocharging. Tribocharging events are mechanical in nature, and thus are slower than the microsecond range, and often are in the ms range. Typical capacitance values of leads in a cable are of the order of 10 pf. Thus, with resistive connectors between 25 kΩ and 400 kΩ, the RC time constant is between 2.5 to 40 ns. Thus, the leads would remain at an equipotential voltage during the Tribocharging event.

In tape and HDD heads, both readers and writers are placed on the same cables. The resistance/impedance of the writers are usually ~15 to 20Ω, and so the same criteria apply to the writers for an internal short as was discussed for the readers. Furthermore, the readers and writers do not function simultaneously, so additional pick-up of the write signals by the readers is not important from a performance perspective. However, it is important to minimize the loss of the write signal through the read lines and visa versa. A simple calculation shows that a shunt between a reader and a writer of greater than 10 kΩ does not cause substantial leakage. As an example, taking a writer with an impedance ($R_{write}$), a write current ($I_{write}$), and a shunt resistance ($R_{shunt3}$) the leakage current from the writer to the reader is of the order of $I_{write}$ ($R_{write}/R_{shunt3}$). For an $R_{write}$ of 20Ω and an $R_{shunt3}$ of 10 kΩ, the leakage current into the reader is 0.2% of the write current. For an $I_{write}$ of 20 mA, the leakage current would be 0.04 mA, which would not cause damage to any modern day sensor used in the magnetic media storage industry.

One additional element which is located on a tape drive head is a servo, which is an MR reader which is used to align the readers and writers in the proper track on the tape. The servos are sensitive to ESD damage and should also have the dissipative connections ($R_{shunt1}$ and/or $R_{shunt3}$). Though some tape products do same-gap-servo tracking so that the servos are reading data at the same time as the writers on the same cabled module are operating, since the servos operate at a frequency outside the range of the writers, the writer leakage can be further suppressed, through the use of filters.

Dissipative Shunt to External Devices

The third choice of resistance values would be for the resistor ($R_{shunt2}$) which connects the elements to external devices. $R_{shunt2}$ is optimally located on the cable in order to minimize the capacitance between the elements and $R_{shunt2}$. $R_{shunt2}$ is chosen to minimize the current through or the voltage across the elements. Taking the circuit to be a simple RC circuit of capacitance C and dissipative resistance to be $R_{shunt2}$ and $R_{dut} \ll R_{shunt2}$, then the RC time constant for dissipation is: $\tau_{RC} \sim CR_{shunt2}$. For a voltage difference between the cable and the external device of V, the charge on the cable ($Q_o$) is CV. The peak current, then is: $I_{peak} = Q_o/\tau_{RC} = V/R_{shunt2}$. The peak voltage across the element of resistance $R_{dut}$, then would be: $V_{peak} = V(R_{dut}/R_{shunt2})$, which drops the value of the voltage differential by the ratio of the device resistance to the shunt resistance, indicating as high a value for $R_{shunt2}$ as possible for protection. The upper limit of $R_{shunt2}$, then would be from a practical value for testing purposes. Assuming that the cable capacitance is substantially lower than the test device capacitance, the cable will reach the test device voltage within a time $\tau_{RC}$. With a device resistance of 100Ω and a value of 10 pf for C, $R_{shunt2}$ values of 100 kΩ to 10 MΩ would yield voltage protection suppressions of between a factor of 1 k and 100 k, and discharge times of between 1 and 100 microseconds. Thus, resistance values for $R_{shunt2}$ within this range are reasonable.

Figure 9:
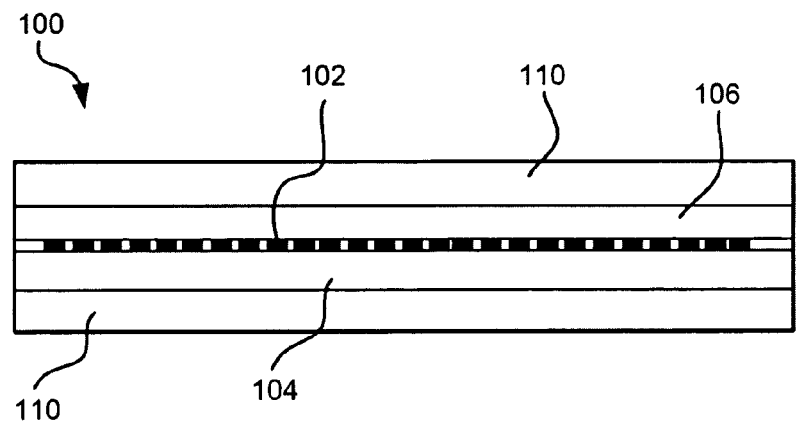
FIG. 9 is a simplified cross sectional view, not to scale, of a cable having multiple leads according to one embodiment.

FIG. 9 depicts a cross section of an illustrative cable 100 similar to that of FIG. 5, taken perpendicular to a longitudinal axis of the cable. Several leads 102 are shown, though the number of leads is not critical. One skilled in the art will appreciate that the number of leads in a particular implementation will depend primarily on the intended application of the cable.

Figure 10:
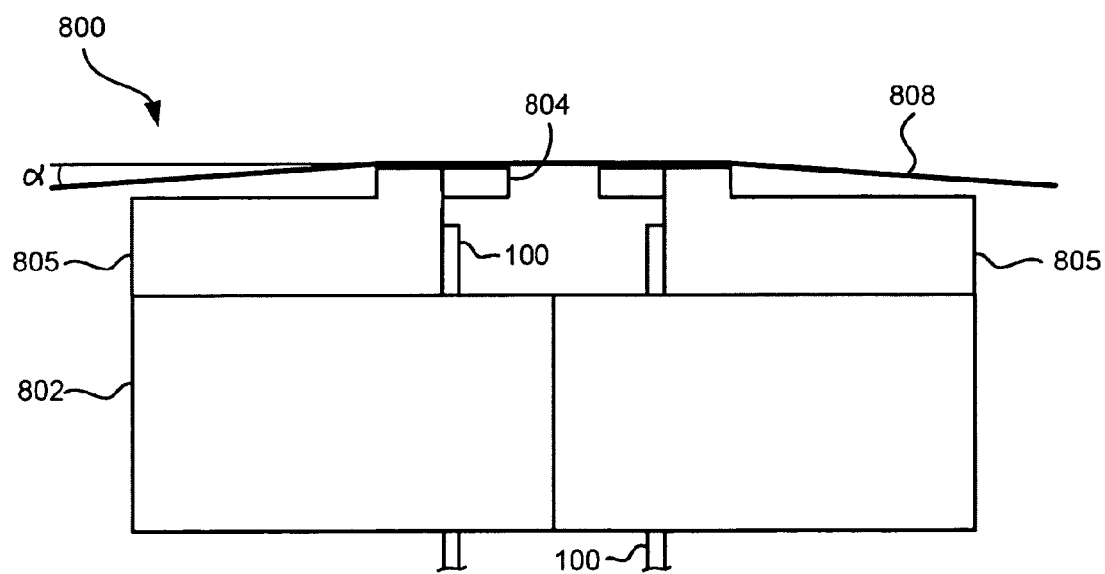
FIG. 10 is a partial side view of a tape head in use.

FIG. 10 illustrates a cable 100 in use. As shown, FIG. 10 illustrates a completed head for a read-while-write bidirectional linear tape drive. "Read-while-write" means that the read element follows behind the write element. This arrangement allows the data just written by the write element to be immediately checked for accuracy and true recording by the trailing read element. Specifically, in FIG. 10, a tape head 800 comprising two modules 805 are mounted on a ceramic substrate 802 which are, in turn, adhesively or otherwise physically coupled. Each of the modules 805 includes several read sensors and/or write transducers electrically coupled to pads (not shown) for subsequent attachment to external electronic devices. Closures 804 are coupled to the modules 805 to support the tape and protect the read/write elements from wear by the tape. Conductive leads in the cables 100 are fixedly and electrically coupled to the pads. The tape 808 wraps over the modules 805 at a predetermined wrap angle α. The closures 804 are typically angled relative to each other such that the tape 808 wraps over the closures 804 at a predetermined wrap angle.

Figure 11:
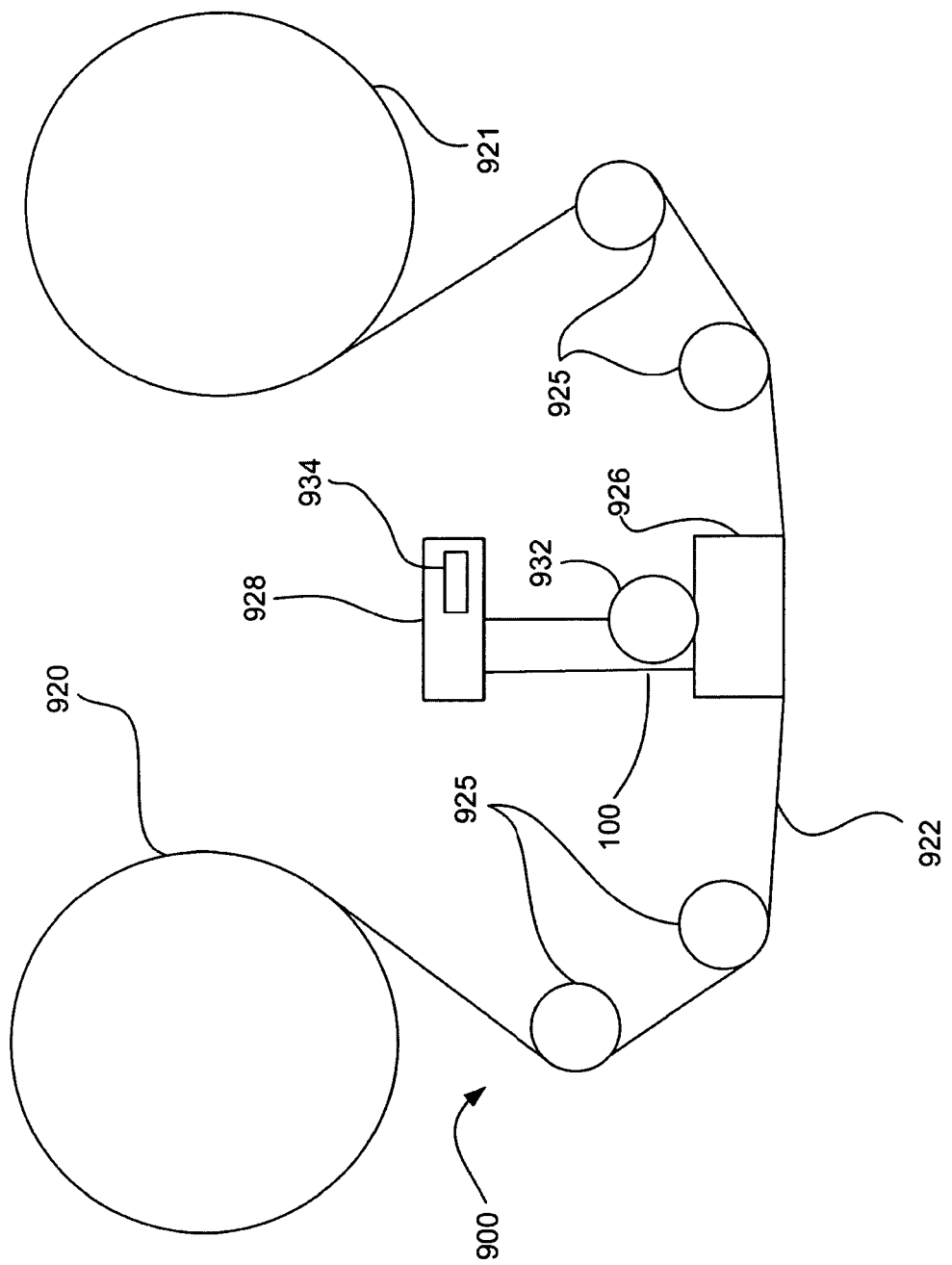
FIG. 11 is a schematic diagram of a simplified tape drive system according to one embodiment.

FIG. 11 illustrates a simplified tape drive 900 of a tape-based data storage system, which may be employed in the context of the present invention. While one specific implementation of a tape drive is shown in FIG. 11, it should be noted that the embodiments described herein may be implemented in the context of any type of tape drive system.

As shown, a tape supply cartridge 920 and a take-up reel 921 are provided to support a tape 922. One or more of the reels may form part of a removable cassette and are not necessarily part of the system 900. The tape drive, such as that illustrated in FIG. 11, may further include drive motor(s) to drive the tape supply cartridge 920 and the take-up reel 921 to move the tape 922 over a tape head 926 of any type.

Guides 925 guide the tape 922 across the tape head 926. Such tape head 926 is in turn coupled to a controller assembly 928 via a cable 100. The controller 928 typically controls head functions such as servo following, writing, reading, etc. The cable 100 may include read/write circuits to transmit data to the head 926 to be recorded on the tape 922 and to receive data read by the head 926 from the tape 922. An actuator 932 controls position of the head 926 relative to the tape 922.

An interface may also be provided for communication between the tape drive and a host (integral or external) to send and receive the data and for controlling the operation of the tape drive and communicating the status of the tape drive to the host, all as will be understood by those of skill in the art.

Although various embodiments have been described as adapted for use with a magnetic tape storage system, the inventive cables may also be used with other electronic devices such as magnetic recording systems and applications using a sensor to detect a magnetic field, optical storage devices, wireless telephones, personal computers, PDAs, etc.

Further, while the foregoing description focuses on a cable, the teachings herein may be applied a PCB board.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A cable, comprising:
a substrate;
an outer layer positioned opposite the substrate;
a plurality of leads sandwiched between the substrate and the outer layer, the plurality of leads lying in a common plane extending parallel to a side of the substrate facing the plurality of leads and the outer layer; and
an electrostatically dissipative adhesive operatively electrically coupling the plurality of leads together,
the adhesive comprising a mixture of an adhesive material and electrically conductive particles intermixed with the adhesive material; and
an insulating layer between all adjacent pairs of leads in the plurality of leads, the insulating layer being different than the electrostatically dissipative adhesive,
wherein the adhesive is sandwiched between the substrate and the plurality of leads for coupling the substrate to the plurality of leads,
wherein the adhesive is also sandwiched between the plurality of leads and the outer layer for coupling the outer layer to the plurality of leads.

2. The cable as recited in claim 1, wherein the electrically conductive particles are present in an amount between 0 and less than 4% by weight of a total weight of the mixture.

3. The cable as recited in claim 1, further comprising a pad, one of the leads of the plurality of leads being electrically coupled to the pad only by the electrostatically dissipative adhesive.

4. The cable as recited in claim 1, further comprising an electrically conductive bar, the electrostatically dissipative adhesive coupling the plurality of leads to the bar.

5. The cable as recited in claim 4, further comprising a pad, the bar being coupled to the pad by the electrostatically dissipative adhesive.

6. The cable as recited in claim 1, wherein the adhesive is also applied to an outer surface of the outer layer of the cable, wherein the adhesive extends an entire length of the outer surface of the outer layer of the cable between distal ends thereof.

7. The cable as recited in claim 1, wherein the conductive particles are selected from a group consisting of antimony doped Sn-oxide, and In:Sn:oxide.

8. The cable as recited in claim 1, wherein the adhesive extends an entire lenuth of the cable between distal ends thereof.

9. The cable as recited in claim 1, wherein the adhesive extends a portion of a length of the cable between distal ends thereof.

10. The cable as recited in claim 1 further comprising an electrostatically dissipative layer on an outer surface of the outer layer.

11. The cable as recited in claim 1, wherein the adhesive, when cured, has an electrical resistance between two adjacent leads of the plurality of leads on the cable of between about 10 kΩ (kilo-ohm) and about 1 MΩ (mega-ohm).

12. The cable as recited in claim 1, wherein the adhesive, when cured, has an electrical resistance between two adjacent leads of the plurality of leads on the cable of about 100 kΩ (kilo-ohm)±50 kΩ.

13. A cable, comprising:
a plurality of leads;
an electrostatically dissipative adhesive, wherein the adhesive is sandwiched between a substrate of the cable and the plurality of leads for coupling the substrate to the plurality of leads, wherein the adhesive is also sandwiched between the plurality of leads and an outer layer of the cable positioned opposite the substrate for coupling the outer layer to the plurality of leads,
the adhesive comprising a mixture of an adhesive material and electrically conductive particles intermixed with the adhesive material,
a window being positioned between the ends of the cable; and
an insulating layer between all adjacent pairs of leads in the plurality of leads, the insulating layer being different than the electrostatically dissipative adhesive,
wherein the electrically conductive particles are present in an amount between 0 and about 10% by weight of a total weight of the mixture,
wherein the conductive particles are selected from a group consisting of antimony doped Sn-oxide, and In:Sn:oxide,
wherein the adhesive, when cured, has an electrical resistance between two adjacent leads of the plurality of leads on the cable of between about 10 kΩ (kilo-ohm) and about 1 MΩ (mega-ohm).

14. A cable, comprising:
an electrically insulating outer layer;
a plurality of leads, all leads of the cable lying in a common plane;
an insulating layer between all adjacent pairs of leads in the plurality of leads; and
an electrostatically dissipative adhesive sandwiched between the plurality of leads and the outer layer for coupling the plurality of leads to the outer layer, the adhesive operatively electrically coupling the plurality of leads together,
the adhesive comprising a mixture of an adhesive material and electrically conductive particles intermixed with the adhesive material, and the insulating layer being different than the electrostatically dissipative adhesive.

15. The cable as recited in claim 14, wherein the adhesive extends an entire length of the cable between distal ends thereof, and further comprising a second outer layer positioned on an opposite side of the plurality of leads than the outer layer, and an electrostatically dissipative layer positioned on an opposite side of the second outer layer than the plurality of leads.

16. The cable as recited in claim 14, and further comprising a second outer layer positioned on an opposite side of the plurality of leads than the outer layer, wherein the electrostatically dissipative adhesive is sandwiched between the plurality of leads and the second outer layer.

17. A method, comprising:
applying an electrostatically dissipative adhesive to leads of a cable exposed in a window of the cable such that the leads are covered between a location of the window and either end of the cable for operatively electrically coupling the leads together,
the adhesive comprising a mixture of an adhesive material and electrically conductive particles intermixed with the adhesive material,
wherein the adhesive, when cured, has an electrical resistance between two adjacent leads on the cable of about 100 kΩ (kilo-ohm)±50 kΩ,
wherein the cable has an electrostatically dissipative layer extending along an outer surface thereof in portions thereof away from the window, wherein an insulating layer is positioned between all adjacent pairs of the leads, the insulating layer being different than the electrostatically dissipative adhesive.

18. The method as recited in claim 17, wherein the adhesive is applied to connect the leads to an electrically conductive bar.

\* \* \* \* \*